(12) United States Patent
Shin et al.

(10) Patent No.: US 11,669,179 B2
(45) Date of Patent: Jun. 6, 2023

(54) FLEXIBLE DISPLAY DEVICE

(71) Applicant: SAMSUNG DISPLAY CO., LTD., Yongin-si (KR)

(72) Inventors: Jaiku Shin, Hwaseong-si (KR); Sojeong La, Suwon-si (KR); Sung Chul Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/323,187

(22) Filed: May 18, 2021

(65) Prior Publication Data

US 2022/0075470 A1 Mar. 10, 2022

(30) Foreign Application Priority Data

Sep. 9, 2020 (KR) .......................... 10-2020-0115614

(51) Int. Cl.
| | |
|---|---|
| *H04M 1/02* | (2006.01) |
| *G06F 1/16* | (2006.01) |
| *H05K 1/14* | (2006.01) |
| *G06F 3/041* | (2006.01) |
| *B32B 27/08* | (2006.01) |

(52) U.S. Cl.
CPC ............ G06F 3/0412 (2013.01); B32B 27/08 (2013.01); *B32B 2307/208* (2013.01); *B32B 2457/208* (2013.01); *G06F 2203/04102* (2013.01)

(58) Field of Classification Search
CPC .................................................. G06F 1/1652
See application file for complete search history.

(56) References Cited

U.S. PATENT DOCUMENTS

| | | | |
|---|---|---|---|
| 10,893,130 B1* | 1/2021 | Song ................... | H04M 1/0237 |
| 2009/0051863 A1* | 2/2009 | Meisner ............... | G09G 3/2096 |
| | | | 313/504 |
| 2014/0146004 A1* | 5/2014 | Jang ...................... | G06F 1/1643 |
| | | | 345/174 |
| 2018/0032163 A1 | 2/2018 | Park et al. | |
| 2018/0192527 A1 | 7/2018 | Yun et al. | |
| 2019/0036068 A1* | 1/2019 | Kim ...................... | G06F 1/1652 |
| 2019/0208655 A1* | 7/2019 | Schafer ................ | H05K 5/0221 |

FOREIGN PATENT DOCUMENTS

KR 10-1750564 6/2017

* cited by examiner

*Primary Examiner* — Nan-Ying Yang
(74) *Attorney, Agent, or Firm* — F. Chau & Associates, LLC

(57) ABSTRACT

A display device includes a panel part including a bending area, a digitizer disposed under the panel part, a first magnetic member disposed under the digitizer, and a second magnetic member disposed under the first magnetic member. The first magnetic member includes a first portion and a second portion, which are spaced apart from each other by a dividing area at least partially overlapping the bending area. The second magnetic member at least partially overlaps the dividing area.

20 Claims, 9 Drawing Sheets

FLEXIBLE DISPLAY DEVICE

CROSS-REFERENCE TO RELATED APPLICATION

This application claims priority to and the benefit of Korean Patent Application No. 10-2020-0115614 filed on Sep. 9, 2020 in the Korean Intellectual Property Office, the disclosure of which is incorporated by reference herein in its entirety.

TECHNICAL FIELD

Embodiments relate to a display device. More particularly, embodiments relate to a flexible display device

DISCUSSION OF THE RELATED ART

Display devices may display an image to provide information to users. While display devices have traditionally been rigid, some display devices are flexible, which allows them to be deformed in one or more ways without damaging the display device. For example, some display devices may be folded along a bending portion. Other display devices may be bent or even rolled up like a piece of paper. Thus, flexible display devices may offer increased portability and convenience for users.

However, as the flexible display device is repeatedly folded and unfolded, a bending portion of the flexible display device may be irreversibly deformed or damaged.

SUMMARY

A display device includes a panel part including a bending area, a digitizer disposed under the panel part, a first magnetic member disposed under the digitizer, and a second magnetic member disposed under the first magnetic member. The first magnetic member includes a first portion and a second portion, which are spaced apart from each other by a dividing area at least partially overlapping the bending area. The second magnetic member at least partially overlaps the dividing area.

The display device may further include a first core structure disposed under the first magnetic member and the second magnetic member. The first core structure may include a stretchable portion at least partially overlapping the dividing area.

The display device may further include a support structure filling at least a portion of the dividing area.

The support structure may include a printed layer disposed on the stretchable portion of the first core structure.

The stretchable portion may have a lattice shape in a plan view, and the printed layer may have a lattice shape corresponding to the stretchable portion.

The support structure may be porous.

The support structure may include a polymeric material.

A height of an upper end of the support structure may be greater than a height of an upper end of the first magnetic member.

A portion of a lower surface of the digitizer may be recessed upwardly to form a recess, and a portion of the support structure may be disposed within the recess.

The second magnetic member may include a first portion and a second portion, which are spaced apart from each other.

The display device may further include a second core structure disposed under the first core structure and including a first portion and a second portion, which may be spaced apart from each other. The second magnetic member may be disposed between the first core structure and the second core structure.

The display device may further include a second core structure disposed under the first core structure and including a first portion and a second portion, which are spaced apart from each other. The second magnetic member may be disposed between the first portion and the second portion of the second core structure.

A width of the dividing area may be greater than a width of the stretchable portion of the first core structure.

The display device may further include an adhesive member disposed between the digitizer and the panel part. The adhesive member may include a first portion and a second portion, which may be spaced apart from each other by a gap at least partially overlapping the stretchable portion.

A display device includes a panel part including a bending area, a digitizer disposed under the panel part, a first magnetic member disposed under the digitizer, and a support structure. The first magnetic member includes a first portion and a second portion, which are spaced apart from each other by a dividing area at least partially overlapping the bending area. The support structure fills at least a portion of the dividing area.

A display device includes a panel part including a bending area, a digitizer disposed under the panel part, a magnetic member disposed under the digitizer, and a support structure disposed between the magnetic member and the digitizer. The digitizer has a lower surface, which includes a recess. A portion of the support structure is disposed within the recess.

A display device includes a panel that includes a folding axis. A first magnet is disposed on a first side of the folding axis. A second magnet disposed on a second side of the folding axis. A third magnet is disposed under the first magnet.

A digitizer may be disposed between the display panel and the first magnet. The first magnet may be spaced apart from the second magnet. The third magnet may at least partially overlap the folding axis.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1:
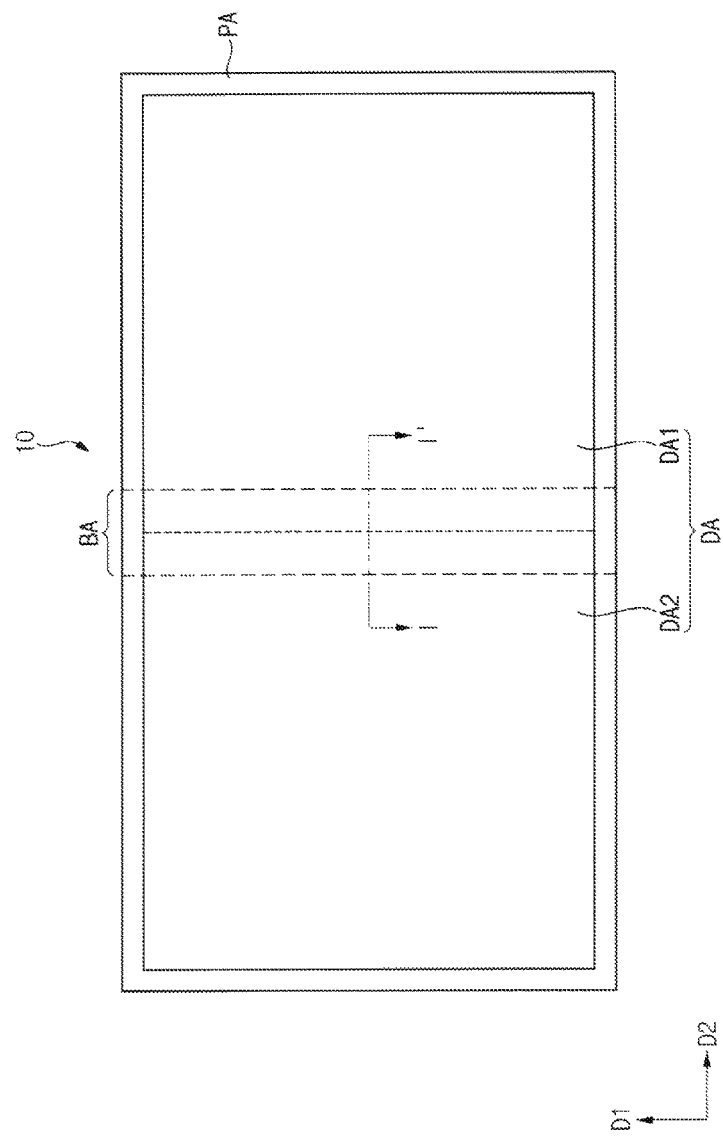
FIG. 1 is a plan view illustrating a display device in an unfolded state, according to an embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Figure 2:
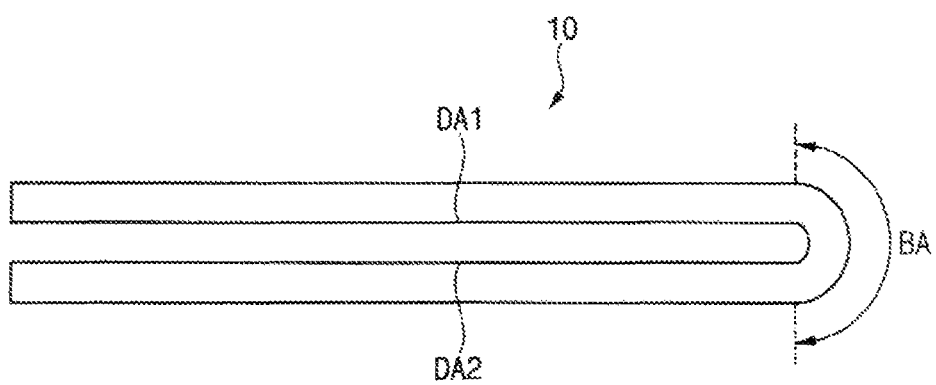
FIG. 2 is a lateral view illustrating a display device in a folded state, according to an embodiment of the present disclosure.

FIG. 1 is a plan view illustrating a display device in an unfolded state, according to an embodiment of the present disclosure. FIG. 2 is a lateral view illustrating a display device in a folded state, according to an embodiment of the present disclosure.

Referring to FIGS. 1 and 2, a display device 10 includes a display area DA configured to generate an image. An area, which is adjacent to the display area DA and does not generate an image, may be referred to as a peripheral area PA. For example, the peripheral area PA may at least partially surround the display area DA.

The display device 10 includes a bending area BA, which may be deformed by an external force so that the display device 10 may be folded or bent. The bending area BA may be part of the display area DA. For example, the bending area BA may include a bending axis extending in a first direction D1. The display area DA may include a first display area DA1 and a second display area DA2, which are adjacent to each other in a second direction D2 crossing the first direction D1. The first display area DA1 and the second display area DA2 may be continuously connected to each other to form a single display area.

For example, the display device 10 may have an in-folding structure so that the first display area DA1 may face the second display area DA2 as illustrated in FIG. 2 when the display device 10 is folded. However, the present invention is not necessarily limited to this particular configuration. For example, a display device according to an embodiment of the present disclosure may have an out-folding structure so that a display area may be outwardly exposed when the display device is folded.

Furthermore, the invention is not necessarily limited to a display device including a single bending area. For example, a display device according to an embodiment of the present disclosure may include a plurality of bending areas so that the display device may be folded several times or so that the display device may be rolled.

Figure 3:
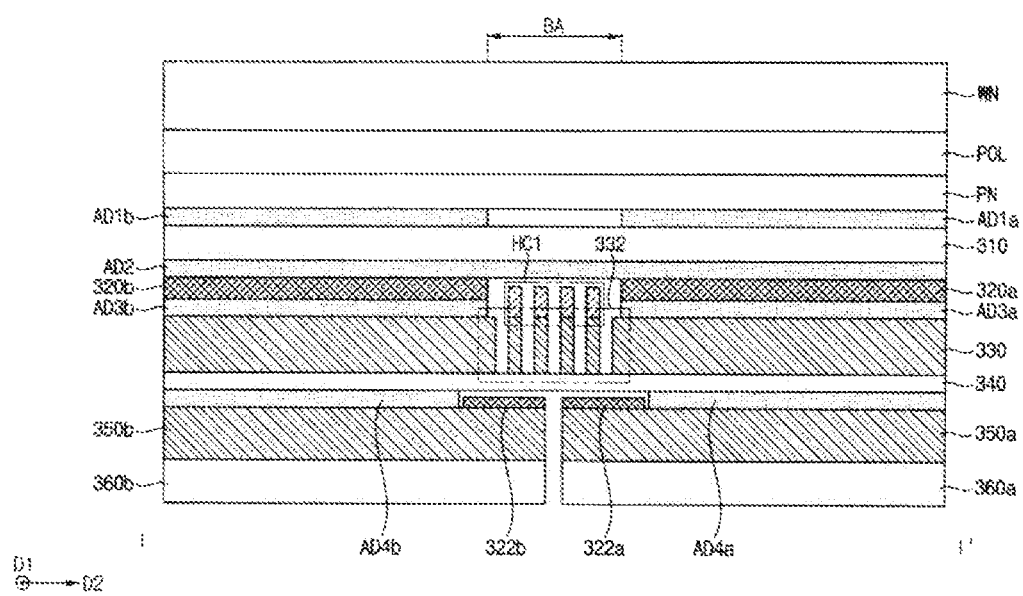
FIG. 3 is a cross-sectional view illustrating a display device according to an embodiment of the present disclosure.

FIG. 3 is a cross-sectional view illustrating a display device according to an embodiment of the present disclosure. FIG. 3 may illustrate a bending area of a display device. For example, FIG. 3 is a cross-sectional view taken along line I-I' of FIG. 1.

Referring to FIG. 3, a display device includes a panel part PN, a digitizer 310 disposed under the panel part PN, a first magnetic member disposed under the digitizer 310, a first core structure 330 disposed under the first magnetic member, and a second magnetic member disposed under the first core structure 330. A protective window WN may be disposed on the panel part PN. A polarizing member POL (e.g. a polarizing filter) may be disposed between the panel part PN and the protective window WN. A second core structure may be disposed under the first core structure 330. A stretchable member 340 may be disposed between the first core structure 330 and the second core structure. An impact-absorbing member may be disposed under the second core structure.

The display device may further include a hinge structure, a hinge cover and the like, which are disposed under the second core structure in the bending area BA.

The protective window WN may include a light-transmitting portion, which at least partially overlaps the display area DA. For example, the protective window WN may include a polymeric material, a glass thin film or a combination thereof configured to be bendable or foldable.

An adhesive layer may be disposed between the protective window WN and the polarizing member POL and between the polarizing member POL and the panel part PN.

In an embodiment of the present disclosure, a first adhesive member (e.g. an adhesive) may be disposed between the panel part PN and the digitizer 310. In an embodiment of the present disclosure, the first adhesive member may include a first portion AD1a and a second portion AD1b, which are spaced apart from each other in the second direction D2. A gap between the first portion AD1a and the second portion AD1b may at least partially overlap the bending area BA. Furthermore, the gap between the first portion AD1a and the second portion AD1b may at least partially overlap a stretchable portion 332 of the first core structure 330. For example, a width of the gap between the first portion AD1a and the second portion AD1b may be greater than a width of the stretchable portion 332.

The first core structure 330 may be heated by an operation of the digitizer 310. When the first adhesive member at least partially overlaps the stretchable portion 332 of the first core structure 330, a lattice shape of the stretchable portion 332 may be transcribed to the first adhesive member due to thermal deformation of the first adhesive member heated by the first core structure 330. When a transcribed lattice shape of the first adhesive member is perceived by users, an exterior appearance and/or an image of the display device may be deteriorated.

A second adhesive member AD2 may be disposed between the digitizer 310 and the first magnetic member 310. In an embodiment of the present disclosure, the second adhesive member AD2 may have a continuous sheet shape. However, the present invention is not necessarily limited to this particular configuration. For example, the second adhesive member AD2 may include a plurality of portions spaced apart from each other as the first adhesive member.

The digitizer 310 is a device that converts a coordinate of an input member such as a pen into a digital data when the input member contacts or gets close to a screen of the display device. In an embodiment of the present disclosure, the digitizer 310 may be operated according to electromagnetic resonance (EMR) method.

The first magnetic member may induce electromagnetic resonance when the input member gets close to the screen of the display device. For example, the first magnetic member may include a magnetic powder. For example, the magnetic powder may include ferrite, molypermalloy, Fe—Si—Al alloy, Ni—Fe alloy or a combination thereof. Furthermore, the first magnetic member may further include a resin to disperse the magnetic powder.

In an embodiment of the present disclosure, the first magnetic member may include a first portion 320a and a second portion 320b, which are spaced apart from each other. A gap between the first portion 320a and the second portion 320b may at least partially overlap the bending area BA, and may at least partially overlap the stretchable portion 332 of the first core structure 330. For example, a width of the gap between the first portion 320a and the second portion 320b may be greater than a width of the stretchable portion 332. The gap between the first portion 320a and the second portion 320b may be referred to as a dividing area.

In an embodiment of the present disclosure, the first portion 320a and the second portion 320b of the first magnetic member may be entirely spaced apart from each other. However, the present invention is not necessarily limited to this particular configuration. For example, the first portion 320a and the second portion 320b of the first magnetic member may be partially connected to each other. For example, the first portion 320a and the second portion 320b of the first magnetic member may be connected to each other in a peripheral area, and the dividing area may have a slit shape extending in the first direction D1 in the first magnetic member.

A third adhesive member may be disposed between the first magnetic member and the first core structure 330. The third adhesive member may include a first portion AD3a and a second portion AD3b, which are spaced apart from each other. However, the present invention is not necessarily limited to this particular configuration. For example, the third adhesive member may have a continuous sheet shape to cover the stretchable portion 332 of the first core structure 330.

The first core structure 330 may include a rigid high-modulus material. For example, the first core structure 330 may include a metal. For example, the first core structure 330 may include SUS (Steel use stainless), Ni—Ti alloy, Ni—Al alloy, Cu—Zn—Ni alloy, Cu—Al—Ni alloy, Cu—Al—Mn alloy, Ti—Ni—Cu—Mo alloy, Co—Ni—Ga:Fe alloy, Ag—Ni alloy, Au—Cd alloy, Fe—Pt alloy, Fe—Ni alloy, In—Cd alloy or a combination thereof.

In an embodiment of the present disclosure, the first core structure 330 includes the stretchable portion 332 configured to be stretchable in response to folding and unfolding the display device. In an embodiment of the present disclosure, the stretchable portion 332 may have a lattice shape. Thus, the stretchable portion 332 may be stretchable and may prevent impurities from entering the panel part PN and the digitizer 310 from a space thereunder. The stretchable portion 332 will be more fully explained below.

A height-compensating support structure HC1 may be disposed between the first portion 320a and the second portion 320b of the first magnetic member. The height-compensating support structure HC1 fills at least a portion of the dividing area, where the first magnetic member is not disposed, to prevent the digitizer 310, the panel part PN disposed on the digitizer 310 or the like from sagging. For example, the height-compensating support structure HC1 may extend in the first direction D1 to have a shape corresponding to the dividing area.

The height-compensating support structure HC1 may be formed by various methods. For example, the height-compensating support structure HC1 may be formed by printing. For example, a resin composition may be coated on the stretchable portion 332 of the first core structure 330 to form the height-compensating support structure HC1. Examples of the resin composition may include a black matrix composition, an ink and the like. However, the present invention is not necessarily limited to this particular configuration. Various compositions, which can form a layer with a sufficient thickness to fill the gap, may be used for forming the height-compensating support structure HC1.

The resin composition may be coated by various methods including spraying, screen printing and the like.

In an embodiment of the present disclosure, the height-compensating support structure HC1 may include a metal, and may be formed by deposition, electroplating or the like.

In an embodiment of the present disclosure, the height-compensating support structure HC1 may have a lattice shape corresponding to a lattice shape of the stretchable portion 332. However, the present invention is not necessarily limited to this particular configuration, and a height-compensating support structure may have various shapes depending on a material and a forming method thereof. For example, a height-compensating support structure may entirely fill the dividing area.

A stretchable member 340 may be disposed under the first core structure 330. The stretchable member 340 may include a material having a high flexibility and a high resilience. For example, the stretchable member 340 may include silicon resin, urethane resin, natural rubber, synthetic rubber, thermoplastic polyurethane or a combination thereof.

A second core structure may be disposed under the stretchable member 340. The second core structure may include a first portion 350a and a second portion 350b, which are separable from each other. Thus, when the display device is folded, a distance between the first portion 350a and the second portion 350b may be increased. The second core structure may include a rigid material such as a metal.

A fourth adhesive member may be disposed between the stretchable member 340 and the second core structure. The fourth adhesive member may include a first portion AD4a and a second portion AD4b, which are spaced apart from each other. However, the present invention is not necessarily limited to this particular configuration. For example, the third adhesive member may have a continuous sheet shape.

The first to fourth adhesive members may each include a conventionally known pressure-sensitive adhesive. However, the present invention is not necessarily limited to this particular configuration, and the first to fourth adhesive members may each include various adhesives.

A second magnetic member may be disposed under the first magnetic member. For example, the second magnetic member may be disposed between the first core structure and the second core structure. The second magnetic member may at least partially overlap the dividing area of the first magnetic member. In an embodiment of the present disclosure, a width of the second magnetic member may be greater than a width of the dividing area.

In an embodiment of the present disclosure, the second magnetic member may include a first portion 322a and a second portion 322b, which are separable from each other. For example, the second magnetic member may be disposed between the first portion AD4a and the second portion AD4b of the second adhesive member. The first portion 322a of the second magnetic member may be combined with an upper surface of the first portion 350a of the second core structure. The second portion 322b of the second magnetic member may be combined with an upper surface of the second portion 350b of the second core structure. An adhesive member may be disposed between the second magnetic member and the second core structure. The second magnetic member may include a same material as the first magnetic member.

An impact-absorbing member may be disposed under the second core structure. In an embodiment of the present disclosure, the impact-absorbing member may include a first portion 360a and a second portion 360b, which are separable from each other.

For example, the impact-absorbing member may have a porous structure. The impact-absorbing member absorbs an impact applied thereto to protect the panel part PN. Furthermore, the impact-absorbing member may prevent impurities from entering the panel part PN.

For example, the impact-absorbing member may include a foam formed from a polymeric material. For example, the impact-absorbing member may include a foam structure, which includes acrylonitrile butadiene styrene copolymer (ABS), polyurethane (PU), polyethylene (PE), ethylene vinyl acetate (EVA), polyvinyl chloride (PVC) or a combination thereof.

In an embodiment of the present disclosure, a first magnetic member disposed under a digitizer includes a plurality of portions, which are spaced apart from each other by a dividing area at least partially overlapping a bending area. Thus, even though a display device is repeatedly folded and unfolded, a crack in the first magnetic member may be prevented. Furthermore, the dividing area of the first magnetic member is covered by a second magnetic member disposed under the first magnetic member. Thus, a magnetic member may be provided for an entire display area.

Embodiments are not limited to a display device including a single bending area. For example, when a display device includes a plurality of bending areas, a first magnetic member may include at least three portions, which are spaced part from each other and correspond to the bending areas, respectively. A core structure may include a plurality of stretchable portions, and the display device may include a plurality of height-compensating support structures.

Figure 4:
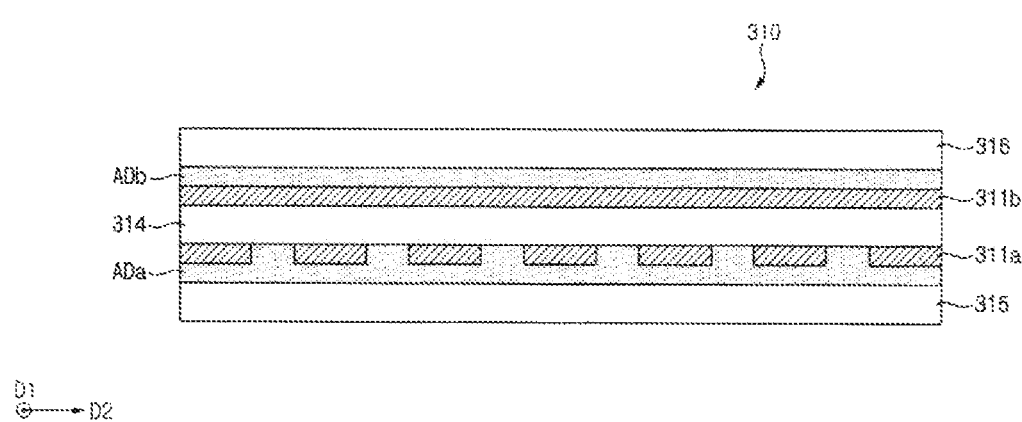
FIG. 4 is a cross-sectional view illustrating a digitizer of a display device according to an embodiment of the present disclosure.

FIG. 4 is a cross-sectional view illustrating a digitizer of a display device according to an embodiment of the present disclosure.

Referring to FIG. 4, a digitizer 310 includes a first electrode array 311a and a second electrode array 311b. The first electrode array 311a and the second electrode array 311b may each include a plurality of linear patters. The linear patterns of the first electrode array 311a may extend to cross the linear patterns of the second electrode array 311b. For example, the linear patterns of the first electrode array 311a may extend in a first direction D1, and the linear patterns of the second electrode array 311b may extend in a second direction D2 crossing the first direction D1.

An insulation layer 314 may be disposed between the first electrode array 311a and the second electrode array 311b. For example, the first electrode array 311a may be disposed on a lower surface of the insulation layer 314, and the second electrode array 311b may be disposed on an upper surface of the insulation layer 314.

The digitizer 310 may further include a protective layer to protect the electrode arrays. In an embodiment of the present disclosure, the digitizer 310 may further include a first protective layer 315, which covers the first electrode array 311a, and a second protective layer 316, which covers the second electrode array 311b. Adhesive members ADa and ADb may be disposed between the protective layers and the corresponding electrode arrays.

The insulation layer 314 and the protective layers 315 and 316 may each include a polymeric material. For example, the insulation layer 314 and the protective layers 315 and 316 may each include polyimide, polyamide, polyolefin, polycarbonate, polyethylene terephtalate or a combination thereof.

The present invention is not necessarily limited to the above-explained configuration, and may include a digitizer having various configurations.

Figure 5:
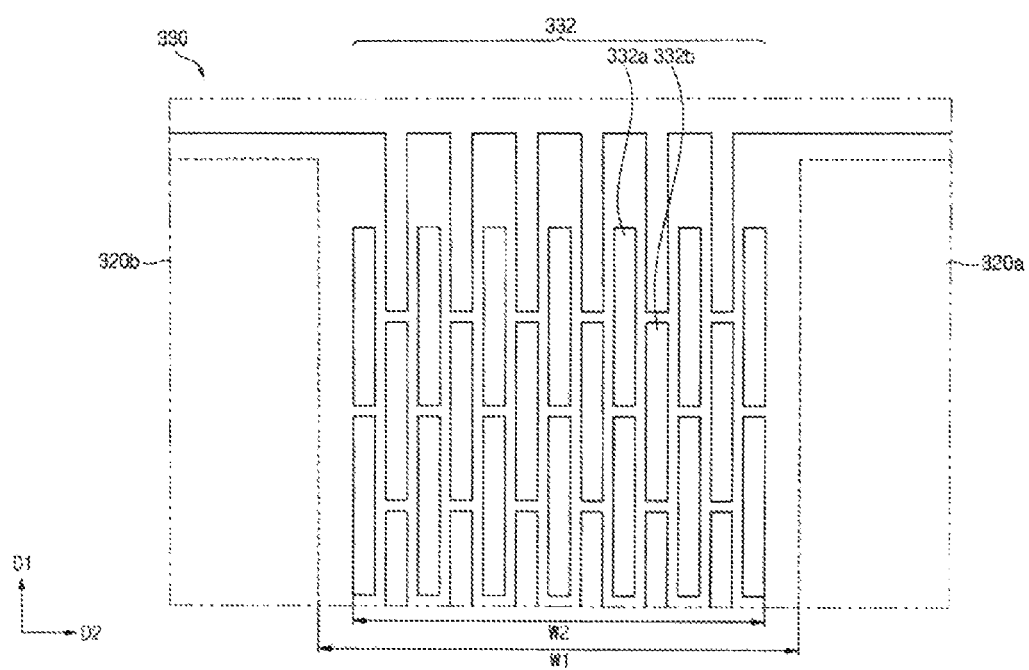
FIG. 5 is a plan view illustrating a first core structure of a display device according to an embodiment of the present disclosure.

FIG. 5 is a plan view illustrating a first core structure of a display device according to an embodiment of the present disclosure.

Referring to FIG. 5, a first core structure 330 includes a stretchable portion 332 having a lattice structure. The stretchable portion 332 includes a plurality of openings. For example, the openings may have a shape extending in a first direction D1, and may be arranged in the first direction D1 and in a second direction D2 crossing the first direction D1. A first opening 332a may be shifted in the first direction D1 from a second opening 332b, which is adjacent to the first opening 332a in the second direction D2, so that the openings may be arranged in a staggered configuration.

In an embodiment of the present disclosure, the openings may each have a rectangular planar shape. However, the present invention is not necessarily limited to this particular configuration. For example, the openings may each have various planar shapes including a triangular shape, a rhombus shape, a hexagonal shape, a circular shape, an oval shape, or the like.

In an embodiment of the present disclosure, a width W1 of a dividing area between a first portion 320a and a second portion 320b of a first magnetic member disposed on the first core structure 330 may be greater than a width W2 of the stretchable portion 332. When the width W1 of the dividing area is excessively small, the stretchable portion 332 may be damaged by a stress concentrated by a corner of the first magnetic member when a display device is folded.

Figure 6:
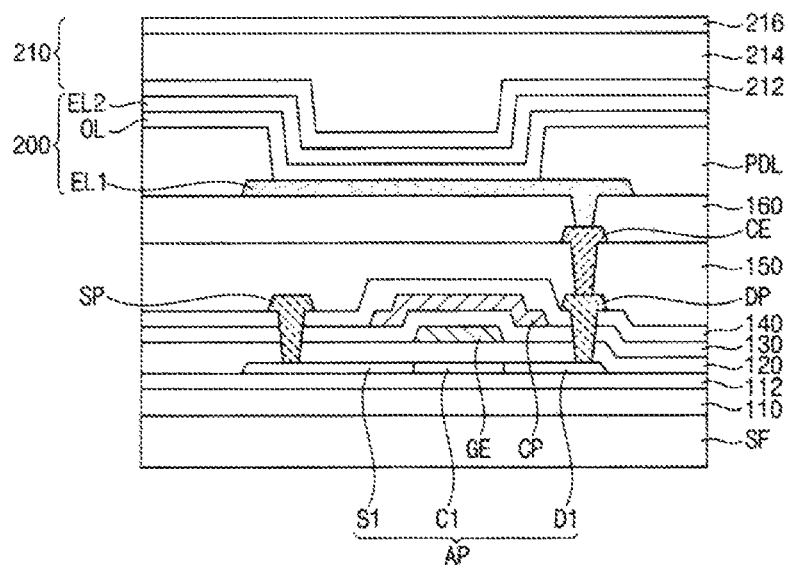
FIG. 6 is a cross-sectional view illustrating a panel part of a display device according to an embodiment of the present disclosure.

FIG. 6 is a cross-sectional view illustrating a panel part of a display device according to an embodiment of the present disclosure. FIG. 6 may illustrate a pixel unit PX disposed in a display area. In an embodiment of the present disclosure, the panel part may be an organic light-emitting display panel.

Referring to FIG. 6, a buffer layer 112 may be disposed on the base substrate 110. An active pattern AP may be disposed on the buffer layer 112.

In an embodiment of the present disclosure, the base substrate 110 may include a polymeric material. For example, the base substrate 110 may include polyethylene terephthalate, polyethylene naphthalate, polyether ketone, polycarbonate, polyarylate, polyether sulfone, polyimide, polybenzoxazole, polybenzobisoxazole, polybenzoimidazole, polybenzothiazole or a combination thereof. In an embodiment of the present disclosure, the base substrate 110 may have a stacked structure including a polymeric film including polyimide and a barrier layer including an inorganic material.

In an embodiment of the present disclosure, a supporting film SF may be disposed under the base substrate 110. The supporting film SF may be a polymeric film supporting the base substrate 110.

The buffer layer 112 may prevent or reduce permeation of impurities, humidity or external gas from underneath of the base substrate 110, and may reduce a roughness of an upper surface of the base substrate 110. For example, the buffer layer 112 may include an inorganic material such as silicon oxide, silicon nitride, silicon oxynitride or the like.

The active pattern AP may include a channel region C1, a source region S1 and a drain region D1. The source region S1 and the drain region D1 may function as a source electrode and a drain electrode, respectively.

A first gate metal pattern may be disposed on the active pattern AP. For example, the first gate metal pattern may include a gate electrode GE at least partially overlapping the channel region C1 of the active pattern AP. A first insulation layer 120 may be disposed between the active pattern AP and the first gate metal pattern.

A second gate metal pattern including a capacitor electrode pattern CP may be disposed on the first gate metal pattern. For example, the capacitor electrode pattern CP may at least partially overlap the gate electrode GE.

A second insulation layer 130 may be disposed between the first gate metal pattern and the second gate metal pattern. A third insulation layer 140 may be disposed on the second gate metal pattern.

For example, the active pattern AP may include silicon or a metal oxide semiconductor. In an embodiment of the present disclosure, the active pattern AP may include polycrystalline silicon (polysilicon), which may be doped with n-type impurities or p-type impurities.

In an embodiment of the present disclosure or in a transistor thereof, an active pattern may include a metal oxide semiconductor. For example, the active pattern may include a binary compound ($AB_x$), a ternary compound ($AB_xC_y$) or a quaternary component compound ($AB_xC_yD_z$), which contains indium (In), zinc (Zn), gallium (Ga), tin (Sn), titanium (Ti), aluminum (Al), hafnium (Hf), zirconium (Zr), and/or magnesium (Mg). For example, the active pattern may include zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

For example, the first insulation layer 120, the second insulation layer 130 and the third insulation layer 140 may each include silicon oxide, silicon nitride, silicon oxynitride or a combination thereof. Furthermore, the first insulation layer 120, the second insulation layer 130 and the third insulation layer 140 may each include an insulating metal oxide such as aluminum oxide, tantalum oxide, hafnium oxide, zirconium oxide, titanium oxide or the like. For example, the first insulation layer 120, the second insulation layer 130 and the third insulation layer 140 may each have a single-layered structure or a multi-layered structure including silicon nitride and/or silicon oxide.

For example, the first gate metal pattern and the second gate metal pattern may each include a metal, a metal alloy, a metal nitride, a conductive metal oxide or the like. For example, the first gate metal pattern and the second gate metal pattern may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 140. The first source metal pattern may include a source pattern SP and a drain pattern DP, which electrically contact the active pattern AP. The source pattern SP and the drain pattern DP may pass through the insulation layers thereunder to contact the source region S1 and the drain region D1 of the active pattern AP, respectively. The first source metal pattern may further include at least one of a connection wiring transferring a signal and a mesh power wiring.

A fourth insulation layer 150 may be disposed on the first source metal pattern. The fourth insulation layer 150 may compensate for a height difference of a structure disposed thereunder to planarize the substrate. The fourth insulation layer 150 may include an organic material. For example, the fourth insulation layer 150 may include an organic insulation material such as a phenol resin, an acryl resin, a polyimide resin, a polyamide resin, a siloxane resin, an epoxy resin or the like. The fourth insulation layer 150 may be referred as to a first via insulation layer or a first organic insulation layer.

A second source metal pattern may be disposed on the fourth insulation layer 150. The second source metal pattern may include a connection electrode CE, which passes through the fourth insulation layer 150 to electrically contact the drain pattern DP. For example, the second source metal pattern may further include at least one of a data line and a power line.

For example, the first source metal pattern and the second source metal pattern may each include Au, Ag, Al, Cu, Ni, Pt, Mg, Cr, W, Mo, Ti, Ta or an alloy thereof, and may have a single-layered structure or a multi-layered structure including different metal layers. In an embodiment of the present disclosure, the first source metal pattern and the second source metal patterns may each have a multi-layered structure including aluminum.

A fifth insulation layer 160 may be disposed on the second source metal pattern. The fifth insulation layer 160 may include a same material as the fourth insulation layer 150. The fifth insulation layer 160 may be referred as to a second via insulation layer or a second organic insulation layer.

A light-emitting element 200 may be disposed on the fifth insulation layer 160. The light-emitting element 200 may include a first electrode EU electrically connected to the connection electrode CE, an organic layer OL disposed on the first electrode EL1 and a second electrode EL2 disposed on the organic layer OL. The first electrode EL1 of the light-emitting element 200 may be electrically connected to the connection electrode CE.

A pixel-defining layer PDL is disposed on the fifth insulation layer 160. The pixel-defining layer PDL includes an opening overlapping at least a portion of the first electrode EL1. At least a portion of the organic layer OL is disposed in the opening. In an embodiment of the present disclosure, the organic layer OL may include a common layer extending continuously over a plurality of pixel areas in the display area. In an embodiment of the present disclosure, the organic layer OL may have an isolated pattern shape disposed in each of the pixel areas. The pixel-defining layer PDL may include an organic material.

The first electrode EL1 may function as an anode. For example, the first electrode EL1 may be formed as a transmitting electrode or a reflecting electrode according to an emission type of the display device. When the first electrode EL1 is a transmitting electrode, the first electrode EL1 may include indium tin oxide, indium zinc oxide, zinc tin oxide, indium oxide, zinc oxide, tin oxide or the like. When the first electrode EL1 is a reflecting electrode, the first electrode EL1 may include Au, Ag, Al, Cu, Ni, Pt, Mg, Cr, W, Mo, Ti or a combination thereof, and may have a stacked structure further including the material that may be used for the transmitting electrode.

The organic layer OL may include at least an emission layer, and may further include at least one of a hole injection layer (HIL), a hole transporting layer (HTL), an electron transporting layer (ETL) and an electron injection layer (EIL). The organic layer OL may include a low molecular weight organic compound or a polymeric organic compound.

In an embodiment of the present disclosure, the organic layer OL may emit a red light, a green light or a blue light. In an embodiment of the present disclosure, the organic layer OL may emit a white light. The organic layer OL emitting a white light may have a multi-layer structure including a red-emitting layer, a green-emitting layer and a blue-emitting layer, or a single-layer structure including a mixture of a red-emitting material, a green-emitting material and a blue-emitting material.

The second electrode EL2 may function as a cathode. The second electrode EL2 may be formed as a transmitting electrode or a reflecting electrode according to an emission type of the display device. For example, the second electrode EL2 may include a metal, a metal alloy, a metal nitride, a metal fluoride, a conductive metal oxide or a combination thereof.

For example, the second electrode EL2 may be formed as a common layer extending continuously over a plurality of pixels in the display area.

An encapsulation layer 210 may be disposed on the second electrode EL2. The encapsulation layer 210 may have a stacked structure of an inorganic thin film and an organic thin film. For example, the encapsulation layer 210 may include a first inorganic thin film 212, an organic thin film 214 disposed on the first inorganic thin film 212 and a second inorganic thin film 216 disposed on the organic thin film 214.

For example, the organic thin film may include a cured polymer resin such as poly(meth)acrylate or the like. For example, the cured polymer resin may be formed by cross-linking reaction of monomers. For example, the inorganic thin films may include silicon oxide, silicon nitride, silicon oxynitride, aluminum oxide, tantalum oxide, hafnium oxide, zirconium oxide, titanium oxide or a combination thereof.

The display device may further include a touch screen structure to sense a position of an input.

FIGS. 7, 8, 9, 10, 11, 12 and 13 are cross-sectional views illustrating a display device according to embodiments of the present disclosure.

Figure 7:
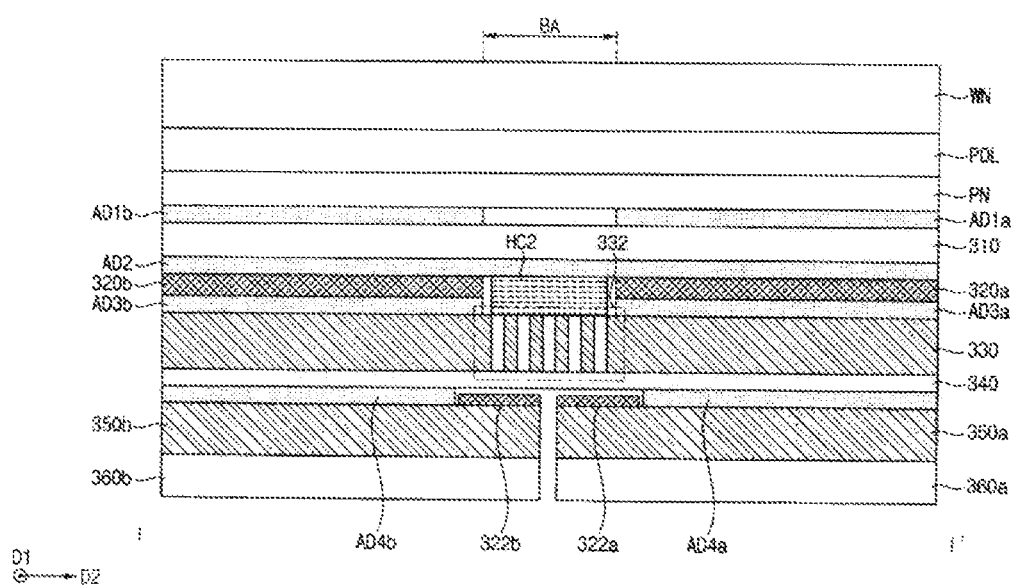
FIGS. 7, 8, 9, 10, 11, 12 and 13 are cross-sectional views illustrating a display device according to embodiments of the present disclosure.

Referring to FIG. 7, a display device includes a panel part PN, a digitizer 310 disposed under the panel part PN, a first magnetic member disposed under the digitizer 310, a first core structure 330 disposed under the first magnetic member, and a second magnetic member disposed under the first core structure 330. The first magnetic member includes a first portion 320a and a second portion 320b, which are spaced apart from each other. The second magnetic member at least partially overlaps a dividing area between of the first portion 320a and the second portion 320b of the first magnetic member. A height-compensating support structure HC2 is disposed in the dividing area.

In an embodiment of the present disclosure, the height-compensating support structure HC2 may have a solid structure. For example, the height-compensating support structure HC2 may include a polymeric film, a cured polymeric resin or the like. For example, the height-compensating support structure HC2 may be formed in an individual process to have a shape same as the dividing area, and then provided in the dividing area.

In an embodiment of the present disclosure, the height-compensating support structure HC2 may include a polymeric material such as silicone resin, thermoplastic polyurethane, polyethylene terephthalate or the like. The height-compensating support structure HC2 may have a film shape, or may have a porous shape like an impact-absorbing member.

For example, the height-compensating support structure HC2 may be attached to an adhesive member AD2 disposed on a lower surface of the digitizer 310. However, the present invention is not necessarily limited to this particular configuration. The height-compensating support structure HC2 may be combined with an upper surface of a stretchable portion 332 of the first core structure 330 by an adhesive member. When a thickness of the adhesive member is excessively large, an adhesive in the adhesive member may enter an opening of the stretchable portion 332 thereby deteriorating a stretchability of the stretchable portion 332. For example, the thickness of the adhesive member contacting the stretchable portion 332 may be equal to or less than about 50 μm.

Figure 8:
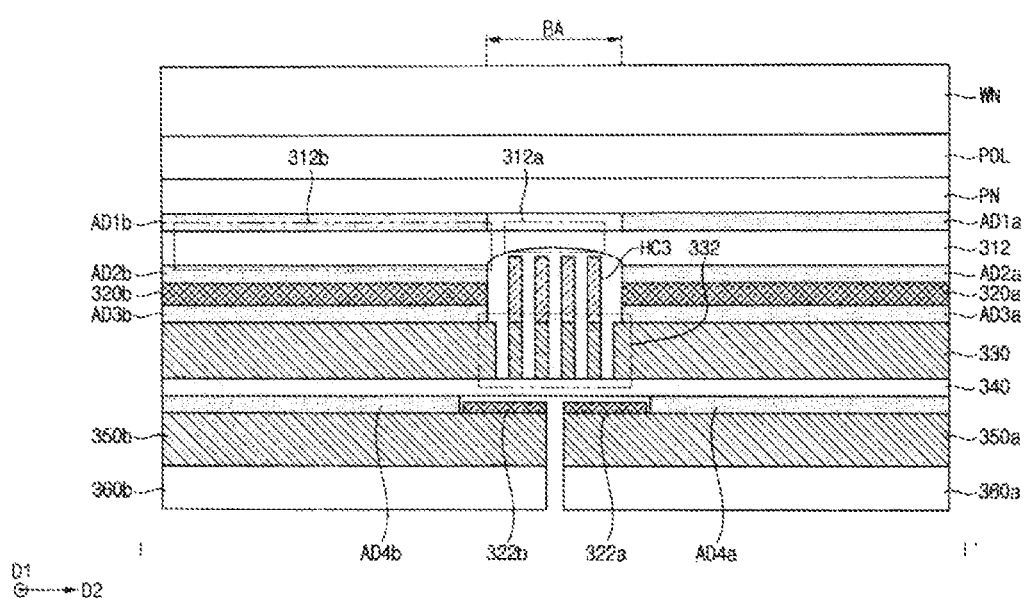

Referring to FIG. 8, a display device includes a panel part PN, a digitizer 312 disposed under the panel part PN, a first magnetic member disposed under the digitizer 312, a first core structure 330 disposed under the first magnetic member, and a second magnetic member disposed under the first core structure 330. The first magnetic member includes a first portion 320a and a second portion 320b, which are spaced apart from each other. The second magnetic member at least partially overlaps a dividing area between of the first portion 320a and the second portion 320b of the first magnetic member. A height-compensating support structure HC3 is disposed in the dividing area.

In an embodiment of the present disclosure, an upper end of the height-compensating support structure HC3 is higher than an upper end of the first magnetic member.

For example, an adhesive member disposed between the digitizer 312 and the first magnetic member may include a first portion AD2a and a second portion AD2b, which are spaced apart from each other. A portion of the height-compensating support structure HC3 may be inserted into a gap between the first portion AD2a and the second portion AD2b of the adhesive member.

In an embodiment of the present disclosure, the digitizer 312 may have a thickness difference. For example, a portion of an electrode array, which at least partially overlaps a bending area BA, in the digitizer 312 may be removed. Thus, a thickness of a first portion 312a of the digitizer 312, which at least partially overlaps the bending area BA, may be smaller than a thickness of a second portion 312b of the digitizer 312, which is adjacent to the first portion 312a. Thus, a portion of a lower surface of the digitizer 312 may be recessed upwardly thereby forming a recess at least partially overlapping the bending area BA.

In an embodiment of the present disclosure, the height-compensating support structure HC3 may compensate for a height difference of the digitizer 312. For example, a portion of the height-compensating support structure HC3 may be disposed within the recess of the digitizer 312. An upper end of the height-compensating support structure HC3 may contact the lower surface of the digitizer 312, or may be spaced apart from the lower surface of the digitizer 312.

Figure 9:
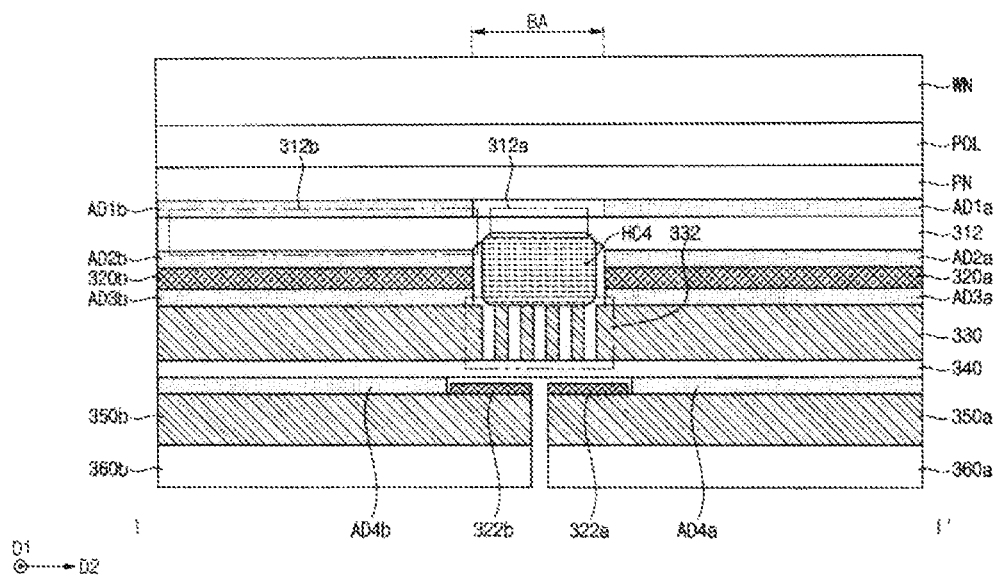

Referring to FIG. 9, a height-compensating support structure HC4 disposed between a first portion 320a and a second portion 320b of a first magnetic member may have a solid structure.

A digitizer 312 disposed on the height-compensating support structure HC4 and the first magnetic member may include a recess, which is recessed upwardly from a lower surface thereof. A portion of the height-compensating support structure HC4 may be disposed within the recess of the digitizer 312.

In an embodiment of the present disclosure, the height-compensating support structure HC4 may be attached to an upper surface of a first core structure 330 disposed thereunder. In an embodiment of the present disclosure, the height-compensating support structure HC4 may be attached to a lower surface of the digitizer 312. In an embodiment of the present disclosure, the height-compensating support structure HC4 may be attached to both the upper surface of the first core structure 330 and the lower surface of the digitizer 312.

Figure 10:
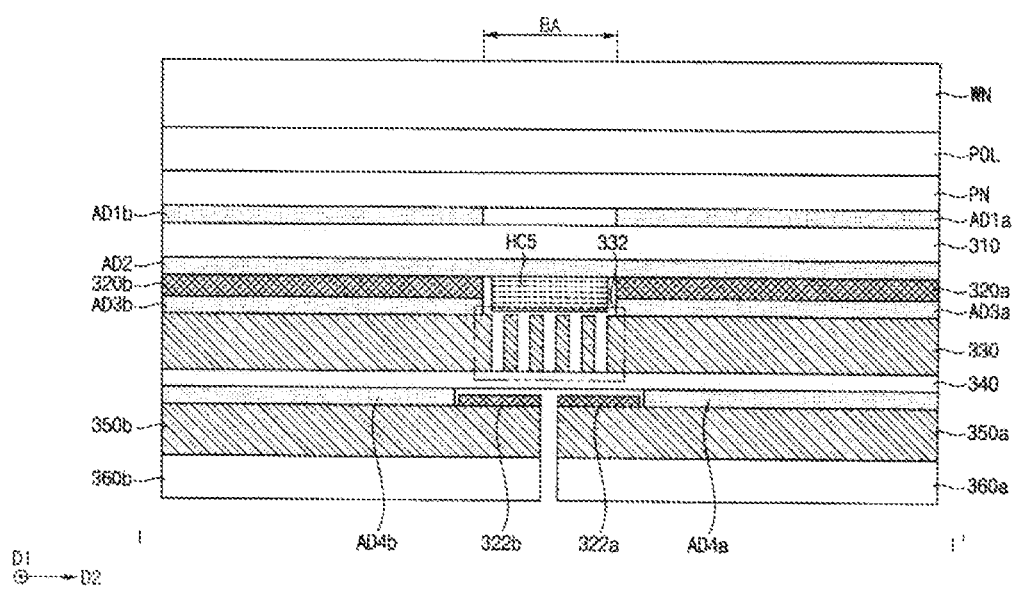

Referring to FIG. 10, a height-compensating support structure HC5 disposed between a first portion 320a and a second portion 320b of a first magnetic member may be attached to a lower surface of a digitizer 312 by an adhesive member AD2 and may be spaced apart from a first core structure 330.

Figure 11:
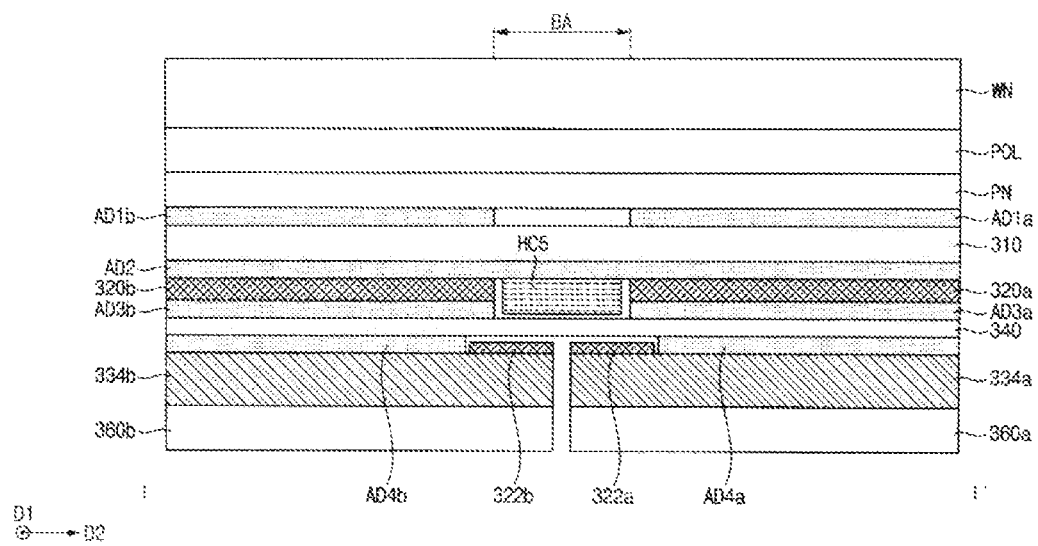

Referring to FIG. 11, a display device includes a panel part PN, a digitizer 310 disposed under the panel part PN, a first magnetic member disposed under the digitizer 310, and a second magnetic member disposed under the first magnetic member. The first magnetic member includes a first portion 320a and a second portion 320b, which are spaced apart from each other. The second magnetic member at least partially overlaps a dividing area between of the first portion 320a and the second portion 320b of the first magnetic member. A height-compensating support structure HC3 is disposed in the dividing area.

In an embodiment of the present disclosure, a first core structure may be disposed under the second magnetic member. For example, the first core structure may include a first portion 334a and a second portion 334b, which are spaced apart from each other. A first portion 322a and a second portion 322b of the second magnetic member may be disposed on the first portion 334a and the second portion 334b of the first core structure, respectively. A stretchable member 340 may be disposed between the first magnetic member and the second magnetic member.

As illustrated in FIG. 11, a first core structure of a display device, according to an embodiment of the present disclosure, might not include a stretchable portion.

Figure 12:
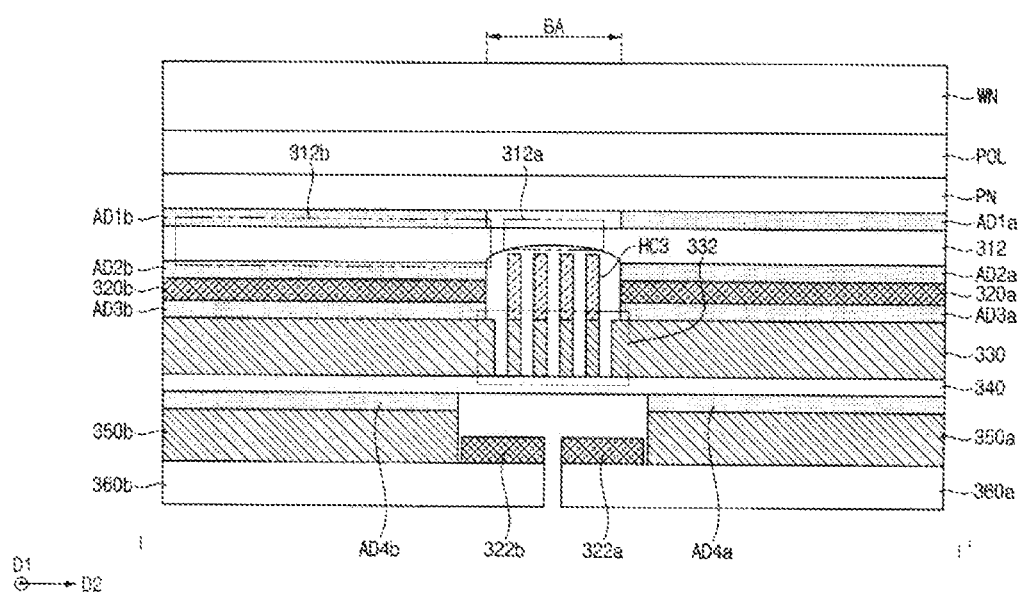

Referring to FIG. 12, a second magnetic member may be disposed between a first portion and a second portion of a second core structure.

For example, a second core structure may be disposed under a first core structure 330, and may include a first portion 350a and a second portion 350b, which are spaced apart from each other. The second magnetic member may be disposed between the first portion 350a and the second portion 350b of the second core structure.

An impact-absorbing member is attached to a lower surface of the second core structure. The impact-absorbing member may include a first portion 360a and a second portion 360b, which are separable from each other.

The second magnetic member may be disposed on an exposed upper surface of the impact-absorbing member. For example, a first portion 322a of the second magnetic member may be attached to an upper surface of the first portion 360a of the impact-absorbing member, and a second portion 322b of the second magnetic member may be attached to an upper surface of the second portion 360b of the impact-absorbing member.

Thus, the second magnetic member may compensate for an area where the first magnetic member is not disposed.

Figure 13:
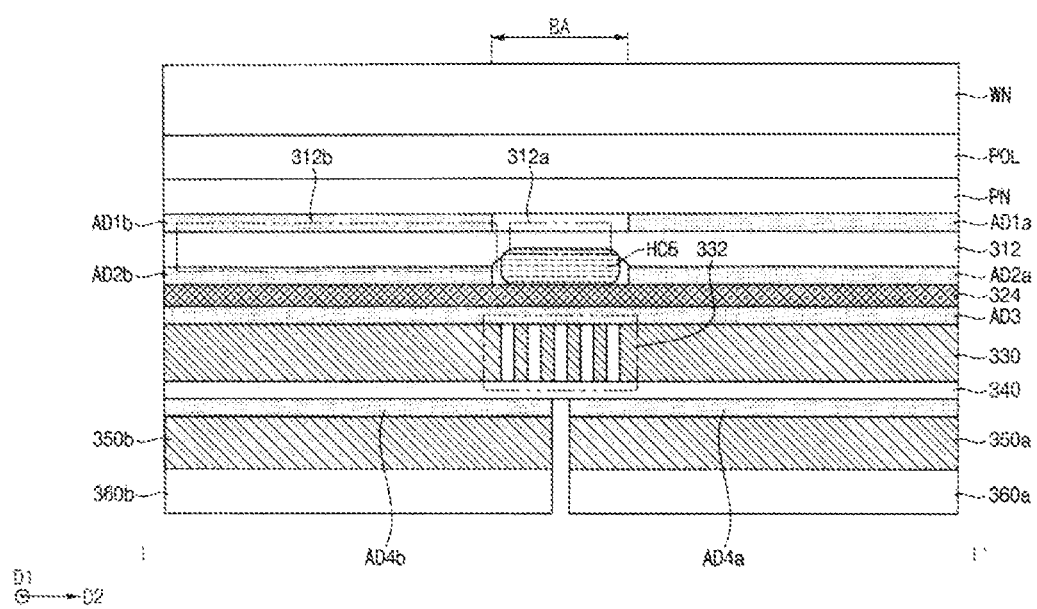

Referring to FIG. 13, a magnetic member 324 disposed between a first core structure 330 and a digitizer 312 may have a continuous sheet shape. Thus, an adhesive member AD3 disposed between the magnetic member 324 and the first core structure 330 may have a continuous sheet shape.

A height-compensating support structure HC6 may be disposed between the magnetic member 324 and the digitizer 312. The digitizer 312 may include a recess, which is recessed upwardly from a lower surface thereof. A portion of the height-compensating support structure HC6 may be disposed within the recess of the digitizer 312.

When a required radius of curvature of the magnetic member 324 is increased, for example, when a display device has an out-folding structure, the magnetic member 324 may have a continuous sheet shape without a dividing area.

The above embodiments provide an organic-light emitting display device. However, the present invention is not necessarily limited to this particular configuration. For example, embodiments may be applied for other display devices such as an inorganic electroluminescent display device, a micro LED display device or the like.

The structures described herein may be applied to various display devices. For example, embodiment of the present disclosure may be applied to vehicle-display device, a ship-display device, an aircraft-display device, portable communication devices, display devices for display or for information transfer, a medical-display device, etc.

The foregoing is illustrative of various embodiments of the present disclosure and those skilled in the art will readily appreciate that many modifications are possible in the embodiments without materially departing from the novel teachings and aspects of the present inventive concept. Accordingly, all such modifications are intended to be included within the scope of the present inventive concept.

What is claimed is:

1. A display device that is foldable with respect to a folding axis, comprising:
    a display panel part that is foldable, the display panel part generating an image of the display device;
    a digitizer disposed under the display panel part and sensing a coordinate of an input member by using electromagnetic resonance;
    a first magnetic member configured to induce electromagnetic resonance with the input member and disposed under the digitizer so that the digitizer is disposed between the display panel part generating the image and the first magnetic member, the first magnetic member including a first portion and a second portion, the first portion and the second portion being disposed on a common plane and spaced apart from each other by a dividing area extending along the folding axis in an unfolded state of the display device; and
    a second magnetic member disposed under the first magnetic member and including a first portion and a second portion,
    wherein a distance between the first portion and the second portion of the second magnetic member is smaller than a distance of the first portion and the second portion of the first magnetic member such that the second magnetic member at least partially overlaps the dividing area.

2. The display device of claim 1, further comprising a first core structure disposed between the first magnetic member and the second magnetic member, the first core structure including a stretchable portion at least partially overlapping the dividing area.

3. The display device of claim 2, further comprising a support structure filling at least a portion of the dividing area.

4. The display device of claim 3, wherein the support structure includes a printed layer disposed on the stretchable portion of the first core structure.

5. The display device of claim 4, wherein the stretchable portion has a lattice shape, and the printed layer has a lattice shape corresponding to the shape of the stretchable portion.

6. The display device of claim 3, wherein the support structure is porous.

7. The display device of claim 3, wherein the support structure includes a polymeric material.

8. The display device of claim 3, wherein a height of an upper end of the support structure is greater than a height of an upper end of the first magnetic member.

9. The display device of claim 3, wherein a portion of a lower surface of the digitizer is recessed upwardly to form a recess, and a portion of the support structure is disposed within the recess.

10. The display device of claim 1, further comprising second core structure disposed under the first core structure, the second core structure including a first portion and a second portion, which are spaced apart from each other, wherein the second magnetic member is disposed between the first core structure and the second core structure.

11. The display device of claim 1, further comprising a second core structure disposed under the fast core structure, the second core structure including a first portion and a second portion, which are spaced apart from each other, wherein the second magnetic member is disposed between the first portion and the second portion of the second core structure.

12. The display device of claim 2, wherein a width of the dividing area is greater than a width of the stretchable portion of the first core structure.

13. The display device of claim 2, further comprising an adhesive member disposed between the digitizer and the display panel part, the adhesive member including a first portion and a second portion, which are spaced apart from each other by a gap at least partially overlapping the stretchable portion.

14. A display device that is foldable with respect to a folding axis, comprising:
- a display panel part that is foldable, the display panel part generating an image of the display device;
- a digitizer disposed under the display panel part and sensing a coordinate of an input member by using electromagnetic resonance;
- a first magnetic member configured to induce electromagnetic resonance with the input member and disposed under the digitizer so that the digitizer is disposed between the display panel part generating the image and the first magnetic member, the first magnetic member including a first portion and a second portion, which are disposed on a common plane and spaced apart from each other by a dividing area extending along the folding axis in an unfolded state of the display device;
- a support structure filing at least a portion of the dividing area; and
- a second magnetic member disposed under the first magnetic member and including a first portion and a second portion,
- wherein a distance between the first portion and the second portion of the second magnetic member is smaller than a distance of the first portion and the second portion of the first magnetic member such that the second magnetic member at least partially overlaps the dividing area.

15. The display device of claim 14, further comprising a first core structure disposed between the first magnetic member and the second magnetic member, the first core structure including a stretchable portion at least partially overlapping the dividing area.

16. The display device of claim 15, wherein the support structure includes a primed layer disposed on the stretchable portion of the first core structure.

17. The display device of claim 14, wherein the support structure is porous.

18. The display device of claim 14, wherein the support structure includes a polymeric material.

19. The display device of claim 14, wherein a height of an upper end of the support structure is greater than a height of an upper end of the first magnetic member.

20. The display device of claim 14, wherein a portion of a lower surface of the digitizer is recessed upwardly to form a recess, and a portion of the support structure is disposed within the recess.

* * * * *